United States Patent
Tan et al.

(10) Patent No.: US 9,129,947 B2
(45) Date of Patent: Sep. 8, 2015

(54) MULTI-CHIP PACKAGING STRUCTURE AND METHOD

(71) Applicant: Silergy Semiconductor Technology (Hangzhou) LTD, Hangzhou, ZheJiang Province (CN)

(72) Inventors: Xiaochun Tan, Hangzhou (CN); Wei Chen, Saratoga, CA (US)

(73) Assignee: Silergy Semiconductor Technology (Hangzhou) LTD, Hangzhou (CN)

( * ) Notice: Subject to any disclaimer, the term of this patent is extended or adjusted under 35 U.S.C. 154(b) by 0 days.

(21) Appl. No.: 13/973,132

(22) Filed: Aug. 22, 2013

(65) Prior Publication Data

US 2014/0070390 A1    Mar. 13, 2014

(30) Foreign Application Priority Data

Sep. 11, 2012 (CN) .......................... 2012 1 0334500

(51) Int. Cl.
*H01L 23/495* (2006.01)
*H01L 23/00* (2006.01)
*H01L 23/31* (2006.01)

(52) U.S. Cl.
CPC ........ *H01L 23/495* (2013.01); *H01L 23/49575* (2013.01); *H01L 24/32* (2013.01); *H01L 24/80* (2013.01); *H01L 23/3107* (2013.01); *H01L 24/29* (2013.01); *H01L 24/48* (2013.01); *H01L 24/49* (2013.01); *H01L 24/73* (2013.01); *H01L 24/92* (2013.01); *H01L 2224/04042* (2013.01); *H01L 2224/29006* (2013.01); *H01L 2224/2919* (2013.01); *H01L 2224/32135* (2013.01); *H01L 2224/32145* (2013.01); *H01L 2224/32245* (2013.01); *H01L 2224/48091* (2013.01); *H01L 2224/48145* (2013.01);

(Continued)

(58) Field of Classification Search
CPC . H01L 23/495; H01L 24/80; H01L 23/49575; H01L 24/32; H01L 2224/92247; H01L 2224/32245; H01L 2224/2919; H01L 23/3107; H01L 2924/30107; H01L 2224/29006; H01L 2224/04042; H01L 2224/32145; H01L 2224/48145; H01L 2224/48247; H01L 2224/49171; H01L 2224/73265; H01L 2924/13091; H01L 2924/00
USPC ............ 257/676, 690, 48, E23.141, 666, 686, 257/685, 723, 777, 784, 786, E23.037, 257/E21.5; 438/109
See application file for complete search history.

(56) References Cited

U.S. PATENT DOCUMENTS 6,919,643 B2    7/2005  Wheeler
7,291,869 B2 *  11/2007 Otremba ....................... 257/107

(Continued)

FOREIGN PATENT DOCUMENTS

CN    101404279 A    4/2009

*Primary Examiner* — Alexander Oscar Williams
(74) *Attorney, Agent, or Firm* — Michael C. Stephens, Jr.

(57) ABSTRACT

In one embodiment, a multi-chip packaging structure can include: (i) N chips, where N is an integer of at least two, and where an upper surface of each chip can include a plurality of pads; (ii) a lead frame with a chip carrier and a plurality of pins, where the N chips are stacked in layers on the chip carrier, and where a chip in an upper layer partially covers a chip in a lower layer such that the plurality of pads of the lower layer chip are exposed; (iii) a plurality of first bonding leads that can connect pads on one chip to pads on another chip; and (iv) a plurality of second bonding leads that can connect pads on at least one chip to the plurality of pins for external connection to the multi-chip packaging structure.

14 Claims, 9 Drawing Sheets

(52) U.S. Cl.
 CPC ............... *H01L 2224/48247* (2013.01); *H01L 2224/49171* (2013.01); *H01L 2224/73265* (2013.01); *H01L 2224/92247* (2013.01); *H01L 2924/13091* (2013.01); *H01L 2924/30107* (2013.01)

(56) References Cited

U.S. PATENT DOCUMENTS

| | | | |
|---|---|---|---|
| 7,309,623 B2 * | 12/2007 | Tan et al. | 438/110 |
| 8,299,588 B1 * | 10/2012 | Tateishi et al. | 257/676 |
| 8,482,112 B1 * | 7/2013 | Liou et al. | 257/686 |
| 8,674,490 B2 * | 3/2014 | Liu et al. | 257/678 |
| 2003/0102489 A1 * | 6/2003 | Nam et al. | 257/177 |
| 2005/0285280 A1 * | 12/2005 | Yau | 257/786 |
| 2006/0226529 A1 * | 10/2006 | Kato et al. | 257/686 |
| 2007/0132079 A1 * | 6/2007 | Otremba et al. | 257/685 |
| 2008/0017907 A1 * | 1/2008 | Otremba | 257/306 |
| 2008/0096316 A1 * | 4/2008 | Tan et al. | 438/109 |
| 2008/0136045 A1 * | 6/2008 | Tan et al. | 257/777 |
| 2009/0174044 A1 * | 7/2009 | Eom et al. | 257/675 |
| 2012/0068320 A1 * | 3/2012 | Yang et al. | 257/676 |
| 2012/0280308 A1 * | 11/2012 | Disney | 257/329 |
| 2013/0043940 A1 * | 2/2013 | Hebert et al. | 327/564 |
| 2014/0003179 A1 * | 1/2014 | Girdhar | 365/226 |
| 2014/0175602 A1 * | 6/2014 | Funaya et al. | 257/531 |
| 2014/0252551 A1 * | 9/2014 | Dix et al. | 257/532 |

* cited by examiner

MULTI-CHIP PACKAGING STRUCTURE AND METHOD

RELATED APPLICATIONS

This application claims the benefit of Chinese Patent Application No. 201210334500.X, filed on Sep. 11, 2012, which is incorporated herein by reference in its entirety.

FIELD OF THE INVENTION

The present invention relates to the field of integrated circuits, and more specifically to multi-chip packaging structures and methods.

BACKGROUND

In the semiconductor industry, the production of integrated circuits can be divided into three phases: integrated circuit design, integrated circuit manufacture, and integrated circuit packaging. In the manufacturing of integrated circuits, the chips are produced through wafer processing to form integrated circuits. When the integrated circuits inside the wafer are completed, and a plurality of solder pads are configured on the wafers, to make "chips" which are formed by wafer cutting, can be electrically connected to carrier devices via pads. For example, a chip carrier can include a lead frame or package substrate. The chips can be connected to a chip carrier by wire or flip-chip bonding, so that these chip pads may be electrically connected to contacts of chip carrier to form a chip packaging structure.

SUMMARY

In one embodiment, a multi-chip packaging structure can include: (i) N chips, where N is an integer of at least two, and where an upper surface of each chip comprises a plurality of pads; (ii) a lead frame with a chip carrier and a plurality of pins, where the N chips are stacked in layers on the chip carrier, and where a chip in an upper layer partially covers a chip in a lower layer such that the plurality of pads of the lower layer chip are exposed; (iii) a plurality of first bonding leads configured to connect pads on one chip to pads on another chip; and (iv) a plurality of second bonding leads configured to connect pads on at least one chip to the plurality of pins for external connection to the multi-chip packaging structure.

In one embodiment, a method of packaging multiple chips can include: (i) sequentially stacking N chips in layers on a chip carrier of a lead frame, where N is an integer of at least two, where an upper surface of each chip comprises a plurality of pads, and where the plurality of pads of a chip in a lower layer are exposed by a chip in an upper layer; (ii) connecting pads on one chip to pads on another chip using a plurality of first bonding leads; (iii) connecting pads on at least one chip to pins of the lead frame using a plurality of second bonding leads; and (iv) packaging the N chips, the plurality of first bonding leads, the plurality of second bonding leads, and the lead frame using a plastic shell that partially exposes the plurality of pins of the lead frame.

Embodiments of the present invention can provide several advantages over conventional approaches, as may become readily apparent from the detailed description of preferred embodiments below.

DETAILED DESCRIPTION

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set fourth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

Semiconductor encapsulation that uses a lead frame as the chip carrier (e.g., quad flat semiconductor package, quad flat leadless type semiconductor package, etc.) may be manufactured by pasting the semiconductor chip on a lead frame. The lead frame may have a carrier and a set of pins, and through a set of bonding leads, the contact pads on the chip surface can be electrically connected to a set of corresponding pins. Encapsulating (plastic shell) coats may be utilized to package the chip and the bonding leads to form a semiconductor package. An important indicator of the measure on how advanced a packaging technology is involves the ratio of the chip area and the packaging area, and a packaging technology may be considered more advanced when the ratio is closer to 1.

Figure 1A:
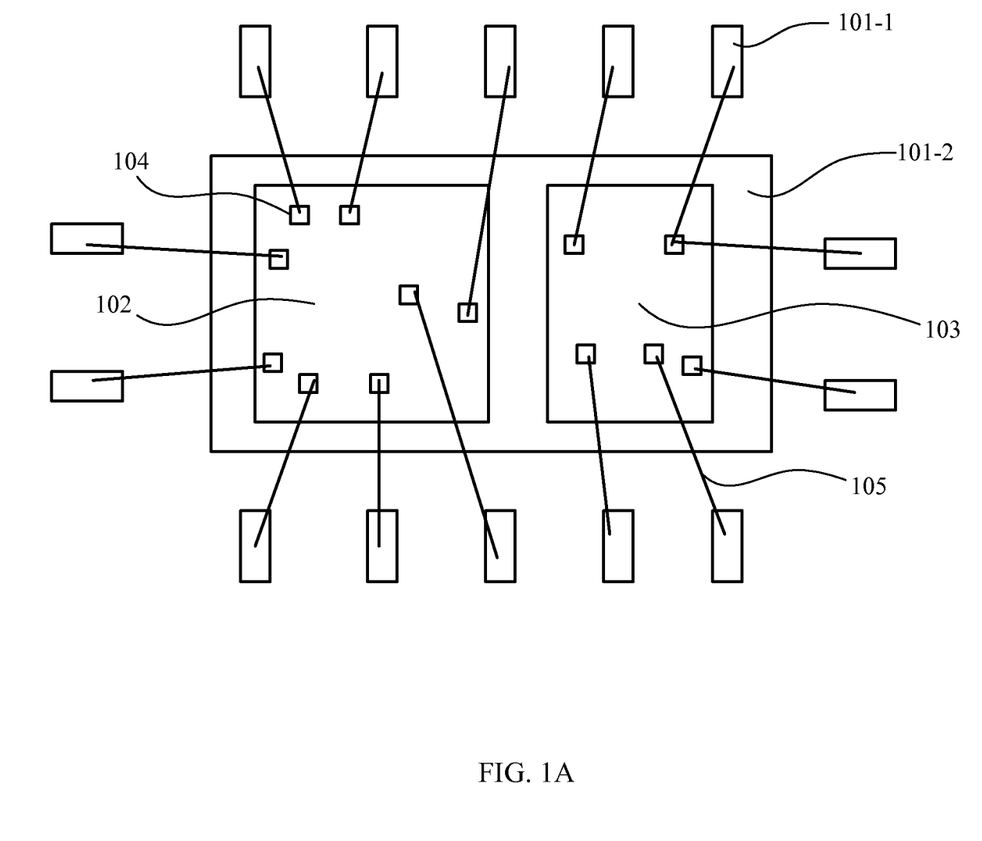
FIG. 1A is a top view of an example multi-chip packaging structure for a power integrated circuit.
Figure 1B:
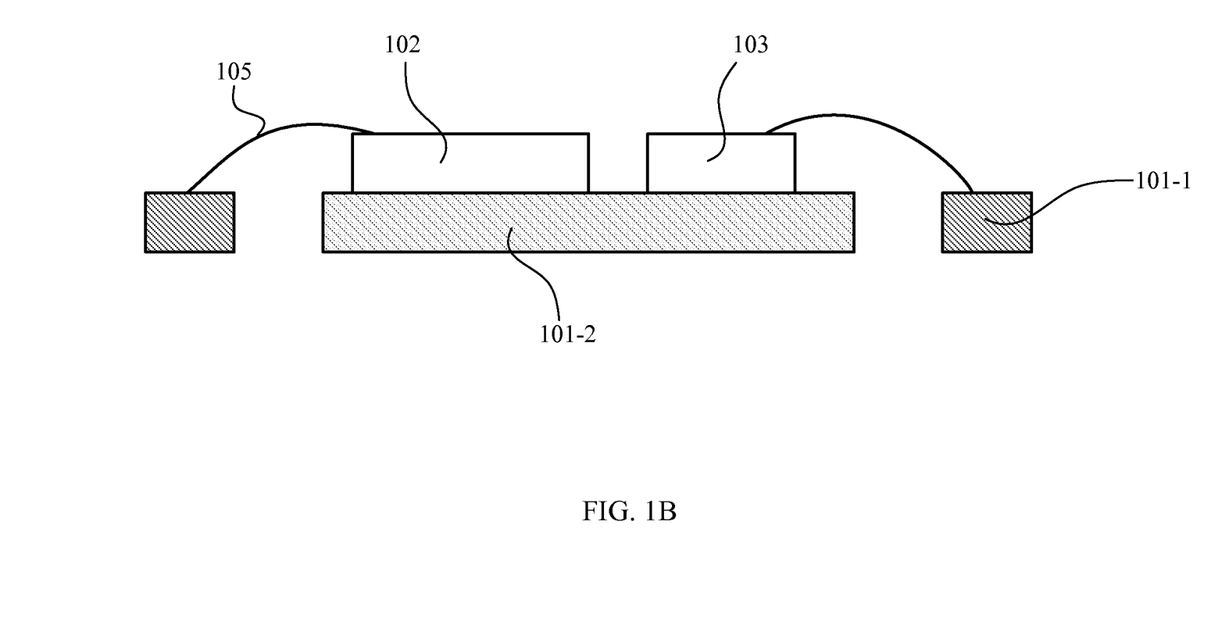
FIG. 1B is a sectional view of the multi-chip packaging structure of FIG. 1A.

Referring to FIG. 1A, shown is a top view of an example multi-chip packaging structure for a power integrated circuit, and FIG. 1B shows a sectional view of the multi-chip packaging structure of FIG. 1A. In this packaging structure example, discrete chip 102 (e.g., power devices, MOSFET transistors, etc.) and chip 103 (e.g., a control circuit) may be arranged in parallel on chip carrier 101-2 of the lead frame. Pads 104 can be connected to corresponding lead frame pins 101-1 through a set of bonding leads 105, to achieve connection between the chips and an external printed circuit board (PCB). By using this chip packaging structure, the area of the package body may be greater than the sum of the area of the two discrete chips 102 and 103. Thus, the packaging area can be relatively large in some cases, and corresponding costs can be also relatively high.

Figure 2A:
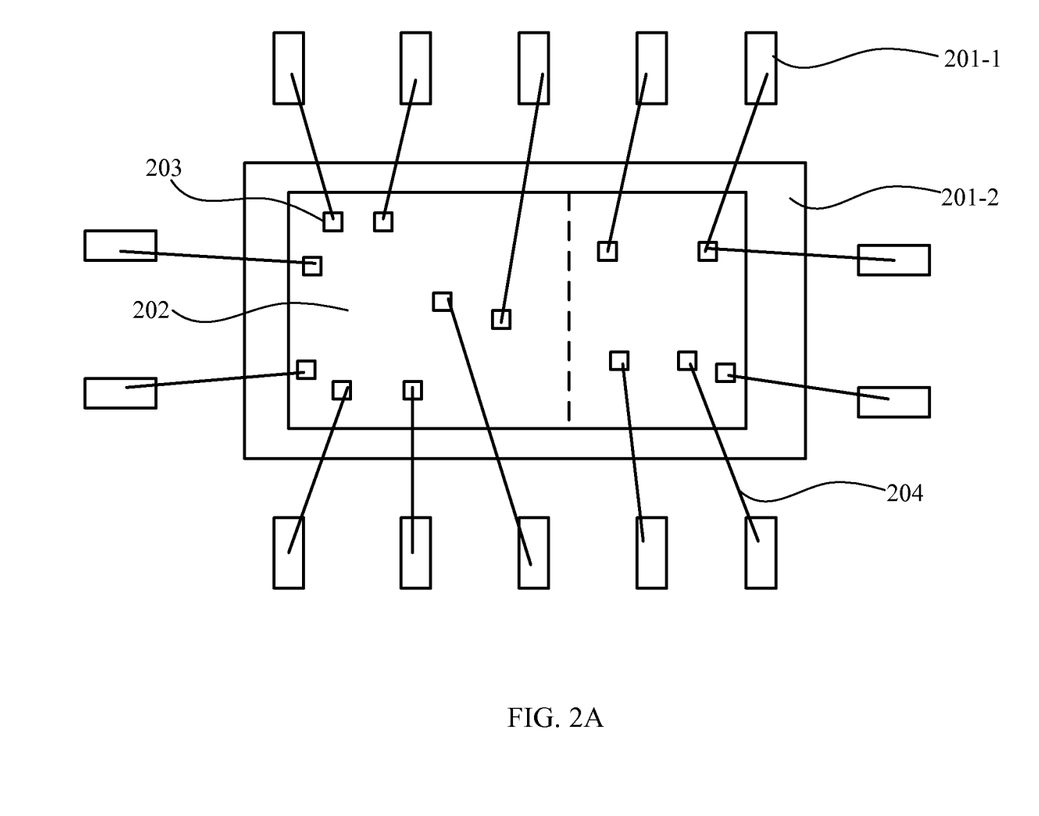
FIG. 2A is a top view of another example multi-chip packaging structure for a power integrated circuit.
Figure 2B:
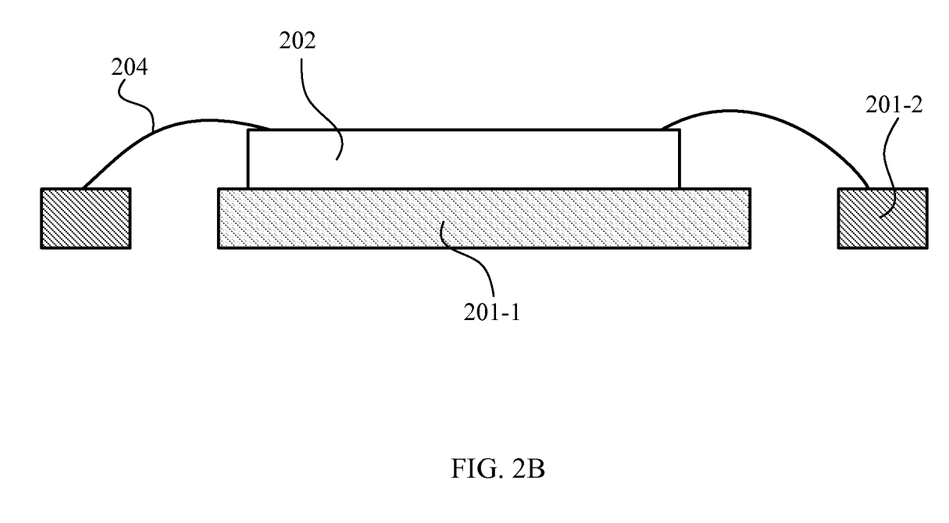
FIG. 2B is a sectional view of the multi-chip packaging structure of FIG. 2A.

Referring now to FIG. 2A, shown is a top view of another example multi-chip packaging structure for a power integrated circuit, and FIG. 2B shows a sectional view of the multi-chip packaging structure of FIG. 2A. Different from the power integrated circuit shown in FIG. 1A, in order to reduce the packaging area, the power device and the control circuit can be integrated in a single chip 202. However, this packaging structure may have relatively strict requirements and specifications on the manufacturing process. The chip manufacturing process can also be relatively complicated, with associated high costs.

In one embodiment, a multi-chip packaging structure can include: (i) N chips, where N is an integer of at least two, and where an upper surface of each chip comprises a plurality of pads; (ii) a lead frame with a chip carrier and a plurality of pins, where the N chips are stacked in layers on the chip carrier, and where a chip in an upper layer partially covers a chip in a lower layer such that the plurality of pads of the lower layer chip are exposed; (iii) a plurality of first bonding leads configured to connect pads on one chip to pads on another chip; and (iv) a plurality of second bonding leads configured to connect pads on at least one chip to the plurality of pins for external connection to the multi-chip packaging structure.

Figure 3A:
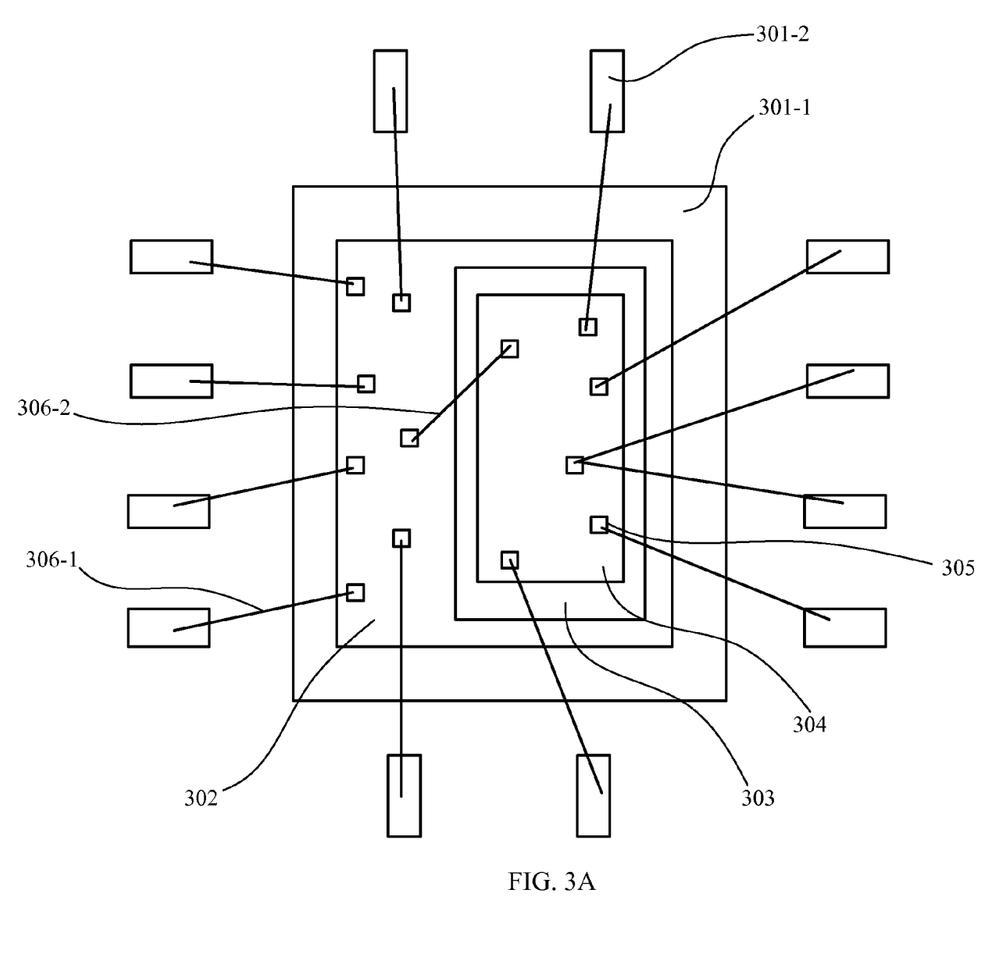
FIG. 3A is a top view of an example multi-chip packaging structure in accordance with embodiments of the present invention.
Figure 3B:
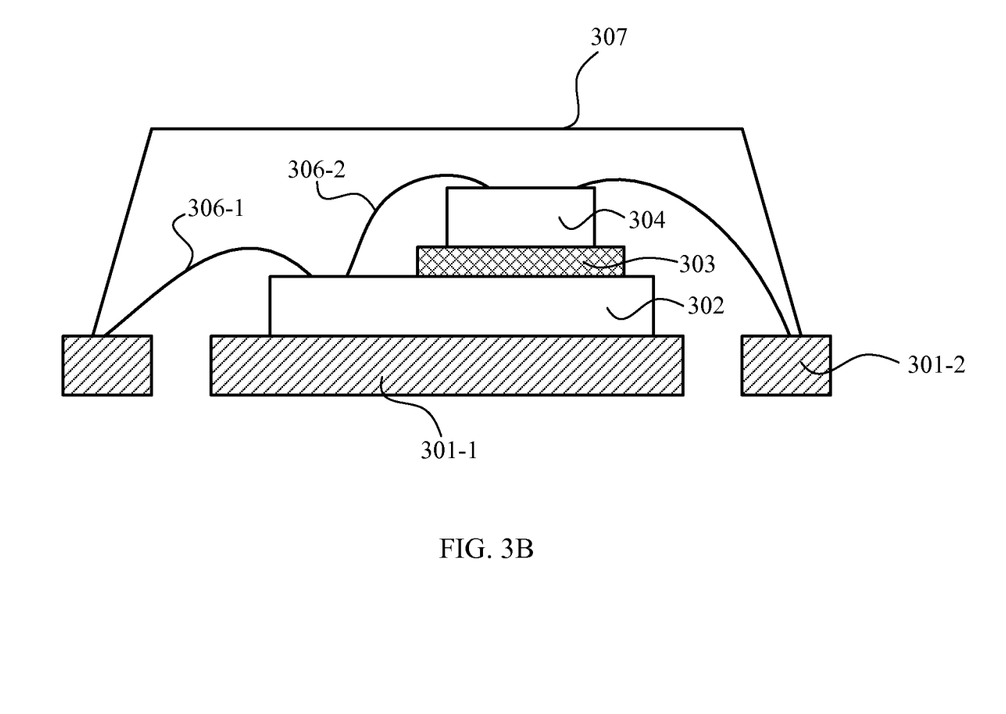
FIG. 3B is a sectional view of the multi-chip packaging structure of FIG. 3A.

Referring now to FIG. 3A, shown is a top view of a multi-chip packaging structure in accordance with embodiments of the present invention, and FIG. 3B shows a sectional view of the multi-chip packaging structure of FIG. 3A. In this example, the multi-chip packaging structure can include two chips and an isolation layer. However, a multi-chip packaging structure in particular embodiments can also be formed without an isolation layer. Chip 302 can be placed on chip carrier 301-1 of the lead frame, and isolation layer 303 can be positioned above chip 302.

Isolation layer 303 can partially cover chip 302 such that a portion of chip 302 with pads 305 can be exposed. That is, at least some of pads 305 on chip 302 can be exposed even after placement of isolation layer 303. Chip 304 can be located above isolation layer 303. Isolation layer 303 may be any suitable isolation layer, such as an epoxy layer and/or a coating layer. Also, plastic shell 307 can cover the stack of chip 302, isolation layer 303, chip 304, chip carrier 301-1, and a portion of pins 301-2, to partially expose pins 301-2. In this way, external electrical connections between chip 302 and chip 304 can be made via partially exposed pins 301-2.

In particular embodiments, some bonding leads may be used to connect pads on one chip in a stack to pads on another chip in the stack, while other bonding leads may be used to connect between pads on a chip and pins for external connection to the packaging structure. For example, a set of first bonding leads 306-1 can connect pads 305 on chip 302 and chip 304 directly to corresponding pins 301-2, to achieve electrical connection between chips and the external PCB board. In addition, a set of second bonding leads 306-2 can connect the pads on chip 304 directly to the corresponding pads on chip 302, to achieve electrical conductivity between different chips inside the multi-chip packaging structure.

In this particular example, chip carrier 301-1, chip 302, isolation layer 303 and chip 304 may be sequentially stacked from the bottom to the top, such that the package size of the multi-chip packaging structure can be greatly reduced. Further, uniform distributed isolation layer 303 can achieve good isolation between chip 302 and chip 304, to avoid signal interference between different chips. In addition, areas of chip 302, isolation layer 303, and chip 304 may also be decreased, to sufficiently support upper layers through the lower layers. In particular embodiments, a multi-chip packaging structure can also be realized without an isolation layer. Through the stack arrangement between the chips, the chip with the largest square area can be located in the bottom layer, and the remaining chips can be sequentially arranged above the bottom chip according to sizes of the remaining chips (e.g., from the largest square area chip in or near the bottom layer sequentially to the smallest square area chip in or near the top layer).

Furthermore, a multi-chip packaging structure in particular embodiments can ensure that first bonding leads 306-1 can be shortened by appropriately setting the relationship between pins 301-2 and pads 305, and the relationship between chip 302, isolation layer 303, and chip 304, in order to reduce power losses caused by resistance of the bonding leads, as well as to improve the reliability of the bonding leads. In this particular example, pads 305 which are on chip 302 in the bottom layer can be located on one side of isolation layer 303, so that pads 305 can be connected to pins 301-2 at the corresponding side through first bonding leads 306-1. Accordingly, pads 305 on chip 304 can be connected to pins 301-2 of the lead frame in the corresponding side through first bonding leads 306-1, to avoid potential crossing of bonding leads, and to further improve the reliability of the packaging structure.

A multi-chip packaging structure in particular embodiments is suitable for high-power integrated circuit packages, such as integrated circuits (ICs) of power supplies, converters, and/or regulators. An integrated circuit for a power supply can generally include a high power device (e.g., a MOSFET lateral double diffused metal oxide semiconductor [LDMOS] transistor), as well as a control and driving circuit for the high-power device.

Figure 4:
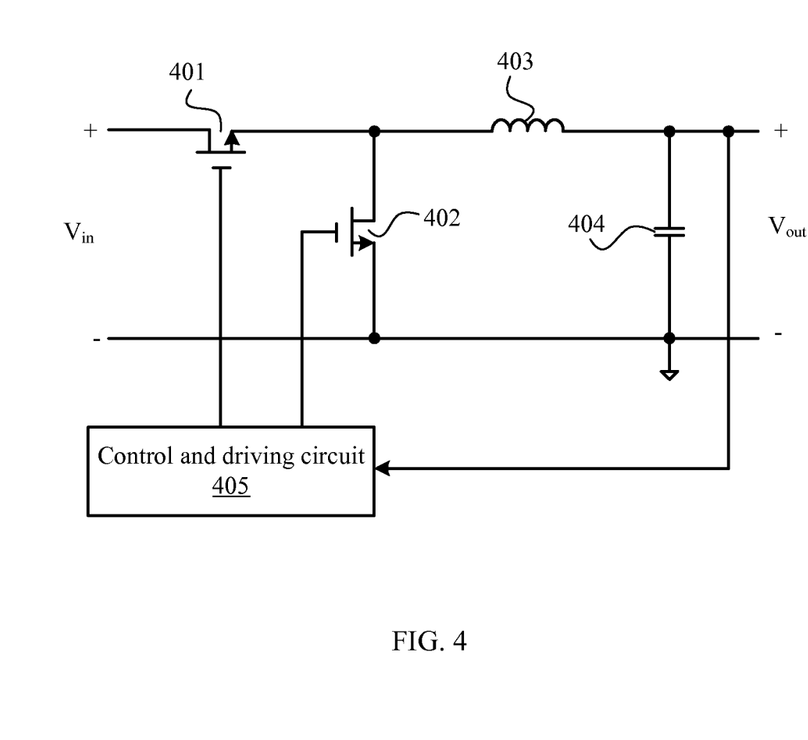
FIG. 4 is a schematic diagram of an example synchronous switching voltage regulator.

Referring now to FIG. 4, shown is a schematic diagram of an example switching voltage regulator. Power transistor 401, power transistor 402, inductor 403, and capacitor 404 can form a synchronous buck power stage circuit. Control and driving circuit 405 can receive an output signal of the power stage circuit, to form a closed-loop feedback control loop to control the switching state of power transistors 401 and 402. In this way, the output signal of the power stage circuit can be controlled to be substantially constant. The packaging structure of FIG. 1A can be employed for this type of power circuitry. Power transistors 401 and 402 can be integrated into a single chip, and control and driving circuit 405 can be integrated into another chip, and then the two chips can be encapsulated essentially in parallel in the packaging structure.

Alternatively, power transistor 401, power transistor 402, and control and driving circuit 405 can be integrated in a single chip through a relatively complicated manufacturing or fabrication process, and then encapsulated in a packaging structure. A switching voltage regulator can further be achieved by utilizing an external inductor 403 and/or capacitor 404. However, such a manufacturing and packaging approach can lead to increased packaging structure area with associated manufacturing costs, and a relatively complicated overall process.

A multi-chip packaging structure in particular embodiments can include power transistor 401 and power transistor 402 being integrated into a power device chip, and control and driving circuit 405 being integrated into a control chip. The power device chip can be placed directly on the chip carrier of the lead frame, such that the area of the power device chip can be as close to the area of the chip carrier as possible. With this package, for the same package area, the area of the power device chip is allowed to be as large as possible in some cases.

Since the power device may process a high voltage and/or a high current, the power device chip with a large area can be able to withstand a relatively high voltage and a relatively high current. Also, the power device may have better thermal characteristics for power supply integration.

Isolation layer 303 can be placed above the power device chip, and may partially cover the power device chip such that pads 305 of the power device chip can be exposed. The control chip can be located above isolation layer 303. Since the control chip may deal with relatively small current signals, a uniform distributed isolation layer 303 can be used to provide insulation and/or isolation between the power device chip and the control chip. This arrangement may be utilised to avoid possible interference due to the high-current power device chip on the control chip.

Furthermore, the control and driving signal of the control chip can be used for driving the power device in the power device chip. Thus, for a multi-chip packaging structure in particular embodiments, inside the packaging structure, the pad of the control and driving signal can be directly connected to the pad of the control terminal of the power device by a second bonding lead. However, in other approaches, the pad of the control and driving signal can be directly connected to the pin of a lead frame through a first bonding lead, and the pad of the control terminal can be connected to another pin of another lead frame through a first bonding lead. Then, the control terminal of the power device can be driven by the control and driving signal through the electrical connection of the external pins in this approach.

However, particular embodiments can provide a direct driving mode by a multi-chip packaging structure with stronger driving capability and improved controllability. In addition, by setting the connection relationship between the pins, influence on signal accuracy and transmission caused by the electro-static discharge (ESD) of the pins to the signals can be substantially avoided.

For the integrated circuit of the switching voltage regulator shown in FIG. 4, if the carrying capacity of power transistor 402 is greater than that of power transistor 401, power transistor 402 may be much larger than power transistor 401. Thus, power transistor 402 (e.g., the synchronous power device) can be integrated in a single synchronous power device chip, and power transistor 401 (e.g., the main power device) as well as control and driving circuit 405 can be integrated in another single mixed chip. The synchronous power device chip can be placed directly on chip carrier 301-1 of the lead frame. Isolation layer 303 can be located above the synchronous power device chip, and the pads on the synchronous power device chip can be exposed. Also, the mixed chip can be placed above isolation layer 303.

With this packaging structure, in the same package area, the area of the synchronized power device chip can be as close to the area of chip carrier 301-1 as possible. Thus, the area of the synchronized power device chip can be as large as possible, which can withstand a relatively high voltage and a relatively high current. Also, the uniform distributed isolation layer 303 can well realize isolation between the synchronized power device chip and the mixed chip, to avoid possible influence of interference between the synchronized power device chip and the mixed chip. In addition, the packaging area can be minimized, and implementation costs can be further reduced.

Other structures and chip arrangements are also suitable in particular embodiments. For example, for the switching regulator as shown in FIG. 4, power transistor 401, power transistor 402, and control and driving circuit 405 can be integrated in a single chip each, and the three chips can be stacked and arranged according to the sizes thereof, in order to optimize package area. In addition, non-synchronous switching power supplies or other types or arrangements of circuitry can also be supported in particular embodiments. For example, the main power device can be integrated in a power device chip, and control and driving circuit 405 can be integrated in a control chip. The power device chip with a relatively large area can be located on chip carrier 301-1 of the lead frame, and through isolation layer 303, the control chip can be located on top of the power device chip.

Figure 5:
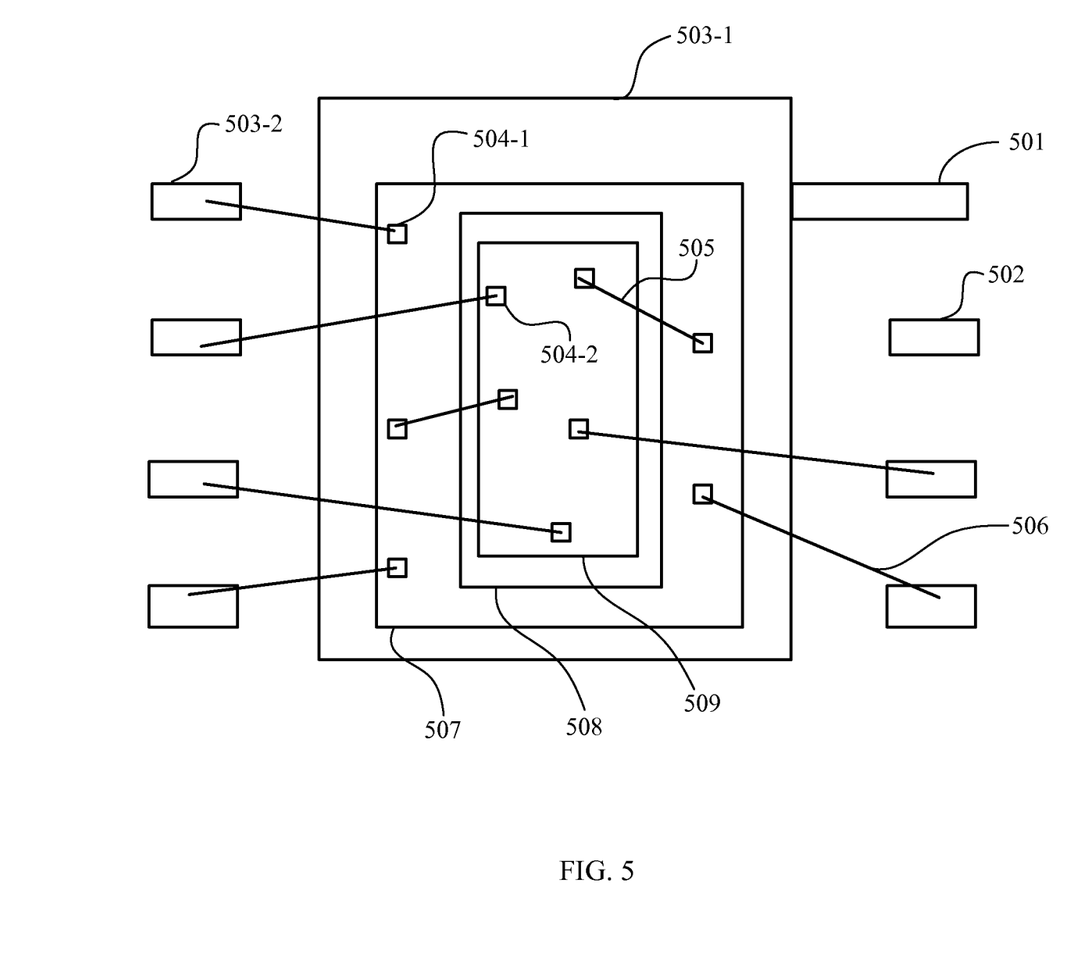
FIG. 5 is a top view of another example multi-chip packaging structure in accordance with embodiments of the present invention.

Referring now to FIG. 5, shown is a top view of an example multi-chip packaging structure according to embodiments of the present invention. This particular example shows another position relationship of the chip and the isolation layer, and the arrangement relationship between the pads and the pins. A power integrated circuit can typically include an input pin (e.g., $V_{in}$-Pin) for receiving a high voltage input, and the relatively high input voltage can cause interference to the pins which are used for processing relatively small signals.

A packaging structure in general can be a rectangular structure, and the pins can have different arrangements. For example, the pins may be arranged on opposite sides of the rectangular structure, on the four peripheral sides of the rectangular structure, on one side of the rectangular structure, or on the three peripheral sides of the rectangular structure. If the pins are arranged on the opposite sides (as shown in FIG. 5), input pin 501 (e.g., Vin) can be set on the outermost side of the packaging structure, and pin 502 that is adjacent to input pin 501 can be configured as a no connect (N/C). In order to avoid possible interference caused by the input pin to the adjacent pin, utilisation of pins can be improved relative to other approaches.

In addition, input pin 501 (e.g., Vin) can be directly connected to chip carrier 503-1 of the lead frame, instead of connecting through first bonding lead 506, to improve the current carrying capacity of input pin 501. This can avoid possible chip failure due to damages on first bonding lead 506 caused by high voltage or current, thereby improving reliability and stability of the packaging structure. In this example, in accordance with the distribution of external pins 503-2, pads 504-1 located at the bottom of chip 507 can be arranged at the corresponding side of isolation layer 508. Similarly, in accordance with the distribution of external pins 503-2, pads 504-2 located on chip 509 can be arranged at the corresponding side of chip 509, so as to minimize the lengths of first bonding leads 506 and second bonding leads 505.

In one embodiment, a method of packaging multiple chips can include: (i) sequentially stacking N chips in layers on a chip carrier of a lead frame, where N is an integer of at least two, where an upper surface of each chip comprises a plurality of pads, and where the plurality of pads of a chip in a lower layer are exposed by a chip in an upper layer; (ii) connecting pads on one chip to pads on another chip using a plurality of first bonding leads; (iii) connecting pads on at least one chip to pins of the lead frame using a plurality of second bonding leads; and (iv) packaging the N chips, the plurality of first bonding leads, the plurality of second bonding leads, and the lead frame using a plastic shell that partially exposes the plurality of pins of the lead frame.

Figure 6:
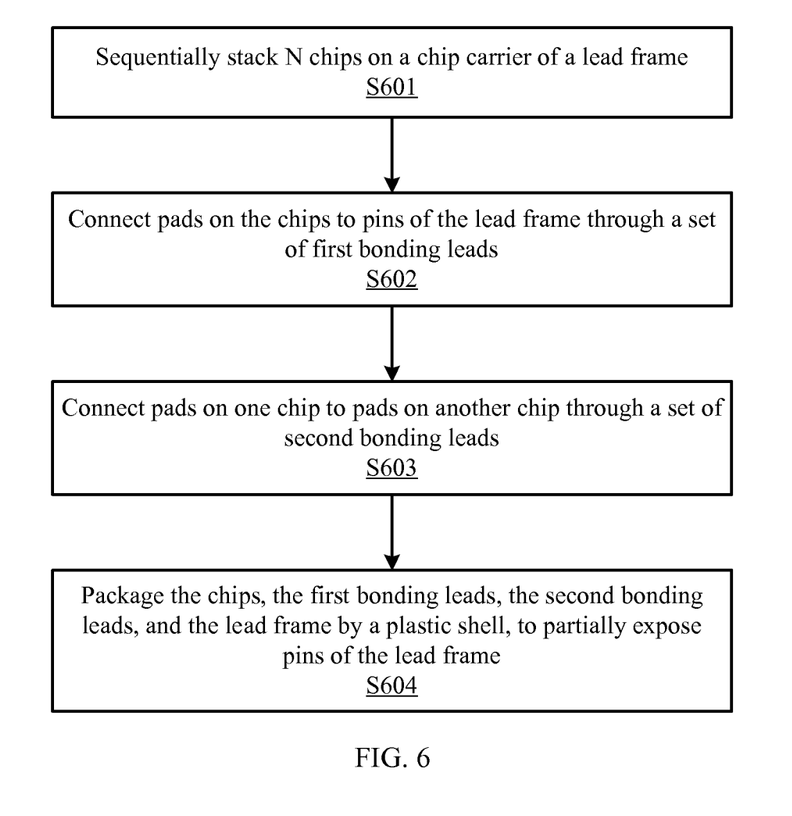
FIG. 6 is a flow diagram of an example multi-chip packaging structure in accordance with embodiments of the present invention.

Referring now to FIG. 6, shown is a flow diagram of a multi-chip packaging method in accordance with embodiments of the present invention. In this particular example, the multi-chip packaging method can include setting an isolation layer. At S601, N chips and N−1 isolation layers can be sequentially stacked (e.g., from a larger square area chip on a lower layer to a smaller square area chip on an upper layer) on a chip carrier of a lead frame. The chips may also be arrayed or otherwise arranged such as to expose pads of the lower layer chip. Also, the isolation layer may cover a lower layer to expose pads of the chip of the lower layer. In addition, spaces or other structures can be included between the chip/isolation layers.

At S602, pads on the chips can be connected to pins of the lead frame through a set of first bonding leads. At S603, pads on one chip can be connected to pads on another chip through a set of second bonding leads. At S604, the chips, the isolation layers, the first bonding leads, the second bonding leads, and the lead frame can be packaged by a plastic shell. Also, the plastic shell can partially expose pins of the lead frame. Further, the plastic shell can also be implemented with other (e.g., ceramic) materials.

In particular embodiments, in some cases an isolation layer may not be utilized, but the stack arrangement may still be formed among multiple chips. Alternatively, only one isolation layer can be inserted between suitable adjacent chips, as opposed to isolation layers being placed between all adjacent chips in the stack.

A multi-chip packaging method in particular embodiments can be well suited for package of the power management integrated circuit. For a non-synchronous switching regulator, N chips may include a power device chip and a control chip, where the power device chip may include a main power device, and the control chip includes a control and driving circuit. For a synchronous switching regulator, N chips may include a power device chip and a control chip, where the power device chip can include a main power device and a synchronized power device, and the control chip includes a control and driving circuit. For a synchronous switching regulator, N chips can also include two power device chips and a control chip, where a power device chip can include a main power device, the other power device chip includes a synchronous power device, and the control chip can include a control and driving device. For a synchronous switching regulator, N chips can also include a power device chip and a mixed chip, where the power device chip can include a synchronization power device, and the control chip includes a control and driving circuit.

In a multi-chip packaging method in particular embodiments, the power device chip or a larger area power device chip can be located directly above the chip carrier, and the area of the power device chip can be slightly smaller than the area of the chip carrier. The driving signal pads of the control chip can be connected to pads of the control terminal of the power device chip through second bonding leads, to achieve direct driving of the power device. For the rectangular configuration of the lead frame, pins can be located in one, two, three or four sides of the lead frame, and a pin that withstands a high voltage or a large current can be located at the outermost of the set of pins. Another pin that is adjacent to the one which withstands a high voltage or a large current can be configured as a no connect pin.

The isolation layer can be any suitable form of isolation layer (e.g., an epoxy resin layer, a coating layer, etc.). A multi-chip packaging structure and packaging method in particular embodiments can be applied to power integrated circuits. However, other types of integrated circuits can also be utilized in particular embodiments. For example, a direct driving mode can't be achieved through the second bonding leads, and the arrangement of pins to process high voltage or large current. To facilitate lead bonding, the isolation layer can be positioned at the appropriate area of the chip, and the position of pins and pads can be correspondingly set to achieve optimal lead bonding.

The embodiments were chosen and described in order to best explain the principles of the invention and its practical applications, to thereby enable others skilled in the art to best utilize the invention and various embodiments with modifications as are suited to the particular use contemplated. It is intended that the scope of the invention be defined by the claims appended hereto and their equivalents.

What is claimed is:

1. A multi-chip packaging structure, comprising:
   a) N chips, wherein N is an integer of at least two, and wherein an upper surface of each chip comprises a plurality of pads;
   b) a lead frame with a chip carrier and a plurality of pins, wherein said N chips are stacked in layers on said chip carrier, and wherein a first chip of said N chips situated in an upper layer comprises a control and driving circuit and partially covers a second chip of said N chips situated in a lower layer such that said plurality of pads of said second chip are exposed, and wherein said second chip comprises a power transistor;
   c) a plurality of first bonding leads configured to connect pads on said first chip to pads on said second chip, wherein a first of said plurality of pins is configured to withstand a high voltage, and wherein a second of said plurality of pins comprises a no connect pin; and
   d) a plurality of second bonding leads configured to connect pads on said first and second chips to said plurality of pins for external connection to said multi-chip packaging structure, wherein said first pin is directly connected to said chip carrier without connecting through any of said plurality of second bonding leads, and wherein said first and second pins are adjacent to each other.

2. The multi-chip packaging structure of claim 1, further comprising an isolated layer located between said first and second chips, and wherein said isolation layer partially covers said second chip such that said plurality of pads of said first and second chips are partially exposed.

3. The multi-chip packaging structure of claim 2, wherein said isolated layer comprises at least one of: an epoxy resin layer, and a coating layer.

4. The multi-chip packaging structure of claim 2, further comprising a plastic shell configured to cover said N chips, said isolated layer, said plurality of first bonding leads, said plurality of second bonding leads, and said lead frame, wherein said plastic shell is configured to partially expose said plurality of pins of said lead frame.

5. The multi-chip packaging structure of claim 2, further comprising N-1 isolation layer, wherein each of said N-1 isolation layers is arranged between corresponding pair of said N chips on said chip carrier.

6. The multi-chip packaging structure of claim 1, wherein said
   b) first chip comprising a control and driving circuit is configured to drive said power transistor.

7. The multi-chip packaging structure of claim 6, wherein a driving signal pad of said first chip is connected to a pad of a control terminal of said second chip through said plurality of first bonding leads.

8. The multi-chip packaging structure of claim 1, wherein:
   a) said plurality of pins are located at side edges of said lead frame; and
   b) said first pin is located at an outermost side of said side edges.

9. The multi-chip packaging structure of claim 1, wherein an area of said second chip is slightly less than an area of said chip carrier.

10. A method of packaging multiple chips, the method comprising:
- a) sequentially stacking N chips in layers on a chip carrier of a lead frame, wherein N is an integer of at least two, wherein an upper surface of each chip comprises a plurality of pads, and wherein said plurality of pads of a first chip of said N chips situated in a lower layer are exposed by a second chip of said N chips in an upper layer that comprises a control and driving circuit, wherein said first chip comprises a power transistor;
- b) connecting pads on said first chip to pads on said second chip using a plurality of first bonding leads, wherein a first of said plurality of pins is configured to withstand a high voltage, and wherein a second of said plurality of pins comprise a no connect pin;
- c) connecting pads on said first and second chips to pins of said lead frame using a plurality of second bonding leads, wherein said first pin is directly connected to said chip carrier without connecting through any of said plurality of second bonding leads, and wherein said first and second pins are adjacent to each other; and
- d) packaging said N chips, said plurality of first bonding leads, said plurality of second bonding leads, and said lead frame using a plastic shell that partially exposes said plurality of pins of said lead frame.

11. The method of claim 10, further comprising:
- a) placing an isolated layer between said first and second chips; and
- b) partially covering said first chip with said isolated layer such that said plurality of pads of said first chip are exposed.

12. The method of claim 10, wherein said first chip is located directly above and with a smaller area than said chip carrier.

13. The method of claim 10, wherein a driving signal pad of said second chip is connected to a pad of a control terminal of said first chip through said plurality of first bonding leads.

14. The method of claim 10, wherein said first pin is located at an outermost side of said side edges of said lead frame.

* * * * *